(12) United States Patent
Mizutani et al.

(10) Patent No.: US 6,956,252 B2
(45) Date of Patent: Oct. 18, 2005

(54) HYBRID INTEGRATED CIRCUIT DEVICE

(75) Inventors: Masahiko Mizutani, Ota (JP);
Sadamichi Takakusaki, Ota (JP);
Motoichi Nezu, Ora-gun (JP);
Kazutoshi Motegi, Ota (JP)

(73) Assignee: Sanyo Electric Co., Ltd., Osaka (JP)

( * ) Notice: Subject to any disclaimer, the term of this patent is extended or adjusted under 35 U.S.C. 154(b) by 39 days.

(21) Appl. No.: 10/421,920

(22) Filed: Apr. 24, 2003

(65) Prior Publication Data

US 2004/0014270 A1 Jan. 22, 2004

(30) Foreign Application Priority Data

Apr. 24, 2002 (JP) ........................................ 2002-121748

(51) Int. Cl.$^7$ ........................................... H01L 27/148
(52) U.S. Cl. ................. 257/226; 257/710; 257/723; 257/787; 438/48; 438/107; 438/112
(58) Field of Search ........................................ 257/226

(56) References Cited

U.S. PATENT DOCUMENTS

| | | | | | |
|---|---|---|---|---|---|
| 5,321,299 A | * | 6/1994 | Ohkawa et al. | ............. | 257/528 |
| 5,399,906 A | * | 3/1995 | Komuro | .................... | 257/705 |
| 5,532,517 A | * | 7/1996 | Kawamoto | ................... | 257/773 |
| 5,650,665 A | * | 7/1997 | Yamamoto et al. | ......... | 257/773 |
| 5,752,182 A | * | 5/1998 | Nakatsuka et al. | ......... | 455/333 |
| 6,087,721 A | * | 7/2000 | Akhnoukh et al. | ......... | 257/705 |
| 6,201,286 B1 | * | 3/2001 | Nagasaka | ..................... | 257/528 |
| 6,257,215 B1 | * | 7/2001 | Kaminaga et al. | .......... | 123/647 |
| 6,259,157 B1 | * | 7/2001 | Sakamoto et al. | .......... | 257/723 |
| 6,495,836 B1 | * | 12/2002 | Hata | ..................... | 250/370.09 |
| 2003/0001255 A1 | | 1/2003 | Iimura et al. | | |
| 2003/0003629 A1 | | 1/2003 | Koike et al. | | |
| 2003/0003630 A1 | | 1/2003 | Iimura et al. | | |

FOREIGN PATENT DOCUMENTS

| | | | | | |
|---|---|---|---|---|---|
| JP | 61144049 A | * | 7/1986 | ............ | H01L/27/01 |
| JP | 08204299 A | * | 8/1996 | ............. | H05K/1/02 |

* cited by examiner

Primary Examiner—Andy Huynh
(74) Attorney, Agent, or Firm—Watchstone P&D

(57) ABSTRACT

In preferred embodiments, a compact a hybrid integrated circuit device 1 can be provided. A conductive pattern 12 is formed on the top surface of a circuit substrate 10, on the top surface of which an insulating layer 11 has been provided. Conductive pattern 12 is formed over the entirety of the top surface of the circuit substrate. Specifically, conductive pattern 12 is also formed at parts within 2 mm from the peripheral ends of circuit substrate 10. Also, a heat sink 13A or other circuit element 13 with some height can be positioned near a peripheral end part of circuit substrate 10. By arranging hybrid integrated circuit device 1, the degree of integration of hybrid integrated circuit is improved. Thus, in a case where the same circuit as a prior-art example is formed, the size of the entire hybrid integrated circuit device can be made small.

31 Claims, 13 Drawing Sheets

HYBRID INTEGRATED CIRCUIT DEVICE

Priority is claimed to Japanese Patent Application Serial Numbers JP2002-121750, filed on Apr. 24, 2002, and JP2002-253987, filed on Aug. 30, 2002, the disclosures of which are incorporated herein by reference in their entireties. Priority is also claimed to Japanese Application Serial Number JP2002-1221748, filed on Apr. 24, 2002. The entire disclosure of the present assignee's co-pending U.S. utility application, filed concurrently on the same filing date as the present application and also claiming priority to the above-listed Japanese Patent Applications, entitled Method For Manufacturing A Hybrid Integrated Circuit Device, and having common inventors, is incorporated herein by reference in its entirety.

BACKGROUND OF THE INVENTION

1. Field of the Invention

The present invention pertains generally to integrated circuit devices and preferred embodiments pertain generally to hybrid integrated circuit devices and, more particularly, to a hybrid integrated circuit device in which, among other things, an adhesion between an insulating resin and a substrate can be improved.

2. Description of the Related Art

The following description sets forth the inventors' knowledge of related art and problems therein and should not necessarily be construed as an admission of knowledge in the prior art.

A hybrid integrated circuit device from the related art shall now be described with reference to FIGS. 11(A)–(B). In this regard, FIG. 11(A) is a perspective view of a hybrid integrated circuit device 6. FIG. 11(B) is a sectional view taken along the line X–X' of FIG. 11(A).

As illustrated in FIGS. 11(A) and 11(B), the existing hybrid integrated circuit device 6 has the following arrangement. The hybrid integrated circuit device 6 includes a rectangular substrate 60, a conductive pattern 62 formed on an insulating layer 61 that is disposed on the top surface of substrate 60, circuit elements 63 affixed onto the conductive pattern 62, metal wires 65 which electrically connect circuit elements 63 with the conductive pattern 62, and leads 64 which are electrically connected with the conductive pattern. The hybrid integrated circuit device 6 is completed as a product by sealing the hybrid integrated circuit formed on the top surface of circuit substrate 60 with an insulating resin or a case material, etc.

A method of manufacturing hybrid integrated circuit device 6 shall now be described with reference to FIGS. 12 to 14. First, a step of partitioning a large-size metal substrate 66A into elongated parts will be described with reference to FIGS. 12(A)–12(B). In this regard, FIG. 12(A) is a plan view of large-size metal substrate 66A and FIG. 12(B) is a sectional view of large-size metal substrate 66A. Now, a method of partitioning large-size metal substrate 66A into elongate parts will be described with reference to FIG. 12(A). As shown in FIG. 12(A), a large-size metal substrate 66A is partitioned into elongated parts along lines D4. This partitioning is performed by shearing using a shear force. The metal substrate that has been partitioned into elongated parts may be partitioned further into two or more parts in consideration of workability in a subsequent bonding step, etc. In the illustrated example, the metal substrate that has been partitioned into elongated parts is partitioned further into two metal substrates 66B that differ in length.

The arrangement of a metal substrate 66A shall now be described with reference to FIG. 12(B). As shown, the substrate 66A is formed of aluminum and both of its surfaces have been subjected to an alumite treatment. In addition, an insulating layer 61, for the insulation of the metal substrate 66A with respect to a conductive pattern, is provided on the surface on which a hybrid integrated circuit is to be formed. A copper foil 68, which becomes a conductive pattern 62 (shown in FIG. 12(B)), is press bonded to insulating layer 61.

A step of forming a hybrid integrated circuit 67 on the top surface of the metal substrate 66B that has been partitioned as an elongate part shall now be described with reference to FIGS. 13(A)–(B). In this regard, FIG. 13(A) is a plan view of an elongated metal substrate 66B on which a plurality of hybrid integrated circuits 67 have been formed. FIG. 13(B) is a sectional view of FIG. 13(A).

First, conductive patterns 62 are formed by etching copper foil 68 that has been press bonded onto insulating layer 61. Here, conductive patterns 62 are etched so as to form a plurality of hybrid integrated circuits on the elongated metal substrate 66B. In some cases, a resin overcoat is applied above the conductive patterns 62 in order to protect conductive patterns 62.

Solder or brazing material is then used to affix circuit elements 63 onto predetermined locations on each conductive pattern 62. Passive elements and active elements may be employed generally as circuit elements 63. In cases where a power transistor is mounted, the transistor is mounted onto a heat sink that is affixed to the conductive pattern.

A method of partitioning the metal substrate 66B, on which a plurality of hybrid integrated circuits 67 have been formed, into individual circuit substrates 60 shall now be described with reference to FIG. 14. As shown, individual circuit substrates 60, each having a hybrid integrated circuit 67 formed on a top surface, are partitioned from metal substrate 66B by punching out parts of the circuit substrate 60 using a press. In this regard, the press punches out the metal substrate 66B from the surfaces on which hybrid integrated circuits 67 are formed. In this manner, in order to carry out the punching operation, margins are provided around the peripheral end parts of circuit substrate 60, at which margins conductive patterns 62 and circuit elements 63 are not formed.

After individually separating the circuit substrates 60 in the above step, the substrates are then completed as products by a step of sealing the hybrid integrated circuit 67, etc.

The above-described hybrid integrated circuit devices and the methods of manufacture thereof had a number of problems.

As a first problem, since circuit substrates 60 are separated from metal substrate 66B by the pressing of metal substrate 66B, at least the parts within 2 mm from the peripheral end parts of circuit substrates 60 were margins (i.e., margins were needed in order to carry out the pressing operation). As a result, a circuit substrate 60 thus had to be formed appreciably greater in size than the conductive pattern formed on the circuit substrate. Accordingly, the peripheral parts of a circuit substrate 60 were dead spaces. Thus, there was, e.g., the problem that even if the degree of integration of hybrid integrated circuit 67 was improved, the device as a whole became large because the circuit substrate 60 itself had to be relatively large.

As a second problem, for similar reasons described above, a heat sink or other circuit element 63 could not be positioned at a peripheral part of a circuit substrate. This became a restriction in designing a conductive pattern 62 and prevented improvement of the density of a hybrid integrated circuit.

As a third problem, since the side faces of the circuit substrate were formed perpendicular to the top surface of the circuit substrate, the adhesion of the circuit substrate with the sealing resin was poor.

As a fourth problem, with the related-art example, the circuit substrate 60 was separated from metal substrate 66B by pressing the metal substrate 66B from the surface on which a circuit is formed. As a result of this process, the portions of the formed substrates along the lower sides (e.g., where the bottom surface of the circuit substrate meets a side face) thus had a rounded shape. As a result, during the molding process, this caused the sealing resin to be set around the rear surface of the circuit substrate. As a result, the sealing resin could become attached to the rear surface of the circuit substrate.

The present invention was made in view of the above and/or other problems in the related art.

SUMMARY OF THE PREFERRED EMBODIMENTS

The preferred embodiments of the present invention have been developed in view of the above mentioned and/or other problems in the related art.

According to some illustrative embodiments, a hybrid integrated circuit device is provided that includes: a circuit substrate formed with metal and having an insulating layer over a top surface; a conductive pattern over the insulating layer; circuit elements mounted over the conductive pattern; and the conductive pattern positioned very near at least one peripheral end of the circuit substrate.

Preferably, the conductive pattern is positioned over substantially the entire top surface of the circuit substrate. Preferably, the conductive pattern is positioned at parts of the top surface of the circuit substrate that are within about 2 mm of the at least one peripheral end of the circuit substrate. In some examples, the top surface of the circuit substrate is generally rectangular with four peripheral edges and wherein the conductive pattern is positioned at parts of the top surface of the circuit substrate that are within about 2 mm of each of the peripheral edges of the top surface of the circuit substrate. In some examples, the substrate is formed of a material principally comprising aluminum or copper. Preferably, the device includes at least some of the circuit elements being positioned very near at least one peripheral end of the circuit substrate. Preferably, the circuit substrate has side faces with inclined parts that incline inwards toward a center of the circuit substrate to anchor the circuit substrate within an insulating resin.

According to other illustrative embodiments, a hybrid integrated circuit device is provided that includes: a circuit substrate formed with metal and having an insulating layer over a top surface; a conductive pattern over the insulating layer; circuit elements mounted onto the conductive pattern; and the circuit elements are positioned very near at least one peripheral end of the circuit substrate.

Preferably, the circuit elements are positioned at parts of the top surface of the circuit substrate that are within about 2 mm from the at least one peripheral end of the circuit substrate. In some examples, a heat sink, having a semiconductor element affixed to its top surface, is positioned at a peripheral part of the circuit substrate. Preferably, the heat sink is positioned at a part of the top surface of the circuit substrate that is within 2 mm from a peripheral end of the circuit substrate.

According to other illustrative embodiments, a hybrid integrated circuit device is provided that includes: a circuit substrate; a conductive pattern over the circuit substrate; circuit elements mounted onto the conductive pattern; an insulating resin sealing the circuit substrate, the conductive pattern and the circuit elements; and the circuit substrate having side faces with inclined parts that incline inwards toward a center of the circuit substrate to anchor the circuit substrate to the insulating resin. Preferably, a rear surface of the circuit substrate is exposed from the resin.

Preferably, the side faces of the circuit substrate have generally vertical parts that extend from the top surface of the circuit substrate and the inclined parts extend inwards beneath the vertical parts. Preferably, angles formed between the top surface of the circuit substrate and the vertical parts are substantially right angles, while angles formed between the rear surface of the circuit substrate and the side faces are obtuse angles. Preferably, the inclined parts are substantially planar and extend from a rear surface of the substrate upwardly and outwardly.

In some preferred embodiments, one or more of the following advantages can be achieved.

First, in some embodiments, a conductive pattern can be formed up to near the end parts of a circuit substrate such that, as compared to, e.g., cases where the same circuit of a related-art example is to be formed, the size of the entire hybrid integrated circuit device can be significantly reduced.

Second, in some embodiments, circuit elements can be positioned up to near the end parts of a circuit substrate 10 such that the degree of freedom of designing an electrical circuit can be improved. Furthermore, because the density of a pattern can be improved, as compared to, e.g., cases where the same circuit of a related-art example is to be formed, the size of the entire hybrid integrated circuit device can be reduced.

Third, in some embodiments, in a hybrid integrated circuit device, the entirety of which is sealed in insulating resin with circuit substrate being exposed, inclined parts are provided at the side faces of circuit substrate, whereby the adhesion of the insulating resin with the circuit substrate can be improved. As a result, separation of circuit substrate from insulating resin can thus be inhibited.

Fourth, in some embodiments, the circuit substrate is manufactured by dicing such that the cross-sectional shape of the side parts where the rear surface of circuit substrate meets the inclined side parts can be shaped to have an obtuse angle. For example, the shape of the parts at which the rear surface of circuit substrate meet the side faces is preferably not, e.g., a rounded shape. Thus, in the process of using a mold for sealing in insulating resin while leaving the rear surface of circuit substrate exposed, the entry of insulating resin into gaps between the mold and circuit substrate can be prevented. As a result, insulating resin can be prevented from flow beneath and attaching to the rear surface of circuit substrate.

The above and/or other aspects, features and/or advantages of various embodiments will be further appreciated in view of the following description in conjunction with the accompanying figures. Various embodiments can include and/or exclude different aspects, features and/or advantages where applicable. In addition, various embodiments can combine one or more aspect or feature of other embodiments where applicable. The descriptions of aspects, features and/ or advantages of particular embodiments should not be construed as limiting other embodiments or the claims.

BRIEF DESCRIPTION OF THE DRAWINGS

The accompanying figures are provided by way of example, without limiting the broad scope of the invention or various other embodiments, wherein.

DETAILED DESCRIPTION OF THE PREFERRED EMBODIMENTS

1. First Embodiment (Showing, e.g., Illustrative Devices)

Figure 1A:
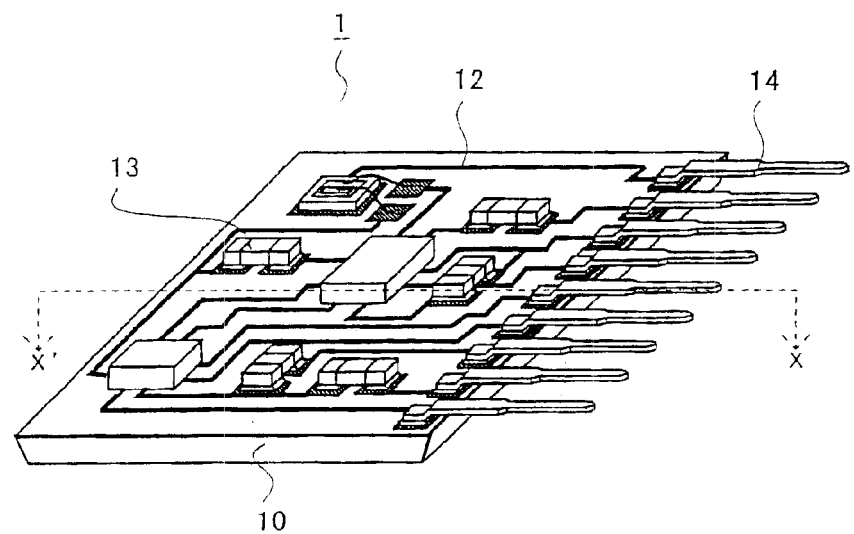
FIG. 1(A) is a perspective view and FIG. 1(B) is a sectional view of a hybrid integrated circuit device according to some illustrative embodiments.
Figure 1B:
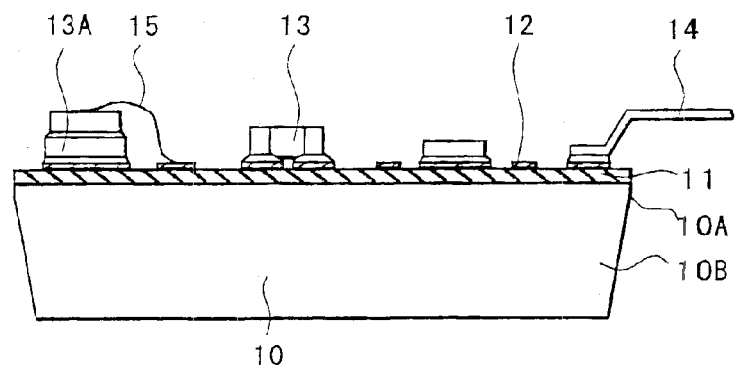

A first illustrative embodiment of the present invention will now be described which demonstrates, among other things, illustrative features of some preferred embodiments of hybrid integrated circuit devices. In this regard, an illustrative arrangement of a hybrid integrated circuit device sealed in an insulating resin is now described with reference to FIGS. 1(A)–(B). FIG. 1(A) is a perspective view of a hybrid integrated circuit device 1. FIG. 1(B) is a sectional view taken along the line X–X' of FIG. 1(A).

As shown in FIGS. 1(A)–(B), a hybrid integrated circuit device 1 is preferably formed as set forth below. In this regard, the hybrid integrated circuit device 1 preferably includes a circuit substrate 10 (formed, e.g., of a metal), an insulating layer 11 (formed, e.g., on a top surface of circuit substrate 10), a conductive pattern 12 (formed, e.g., on the insulating layer 11), circuit elements 13 (mounted, e.g., to predetermined positions on conductive pattern 12), etc. These preferred components shall now be described in detail with reference to some illustrative embodiments.

First, the circuit substrate 10 will now be described. In preferred embodiments, aluminum, copper and/or another metal is used for the material of the circuit substrate 10. In some embodiments, an alloy can be used for the material of circuit substrate 10. In various embodiments, any appropriate materials known to those in the art may be employed. In some preferred embodiments, a circuit substrate 10 that is formed of aluminum is employed. Preferably, both surfaces of the substrate have been subjected to an alumite treatment. In some illustrative embodiments, a side face of circuit substrate 10 is formed with a vertical part 10A that extends vertically from the top surface and an inclined part 10B that inclines towards an inner side of the circuit substrate 10 as it extends downwards from vertical part 10A. While, in some embodiments, the vertical part 10A can be oriented in or substantially in an exactly vertical orientation, in this disclosure, the terminology vertical or vertical part does not signify an exactly vertical orientation, but also encompasses generally vertical orientations.

Preferably, the inclined parts 10B are formed on the side faces of circuit substrate 10 during the manufacturing method. In preferred embodiments, the circuit substrate 10 is manufactured by cutting and dividing a large-size substrate. In a first step, V-shaped or generally V-shaped grooves are preferably formed in a rear surface of the large-size substrate. Then, in a second step, to separate the large-size substrate into individual substrates, the remaining thicknesses of the substrate above the V-shaped grooves are preferably removed starting from, preferably, the top surface. In this manner, the sides of the V-shaped groove parts become the inclined parts 10B of the individual substrates. An illustrative manufacturing method according to some illustrative embodiments for forming circuit substrates 10 shall be described below to demonstrate, by way of example, methods of manufacturing a hybrid integrated circuit device.

Second, the insulating layer 11 will now be described. Insulating layer 11 is preferably formed on a top surface of circuit substrate 10. Preferably, the insulating layer has a function of insulating the conductive pattern 12 and the circuit substrate. Preferably, the insulating layer 11 is also highly filled with, for example, alumina for actively transferring heat generated from, e.g., circuit elements 13 to the circuit substrate 10.

Third, the conductive pattern will now be described. The conductive pattern 12 is preferably disposed on a top surface of insulating layer 11. Preferably, it is formed with copper and/or another metal. In the preferred embodiments, the conductive pattern 12 is formed across substantially the entire or the entire top surface of circuit substrate 10. In this regard, in preferred embodiments, the conductive pattern 12 is formed near one or more peripheral ends of the circuit substrate. In some embodiments, the conductive pattern extends to within 2 mm from one or more peripheral ends of circuit substrate 10. In some embodiments, the conductive pattern extends to within 1 mm from one or more peripheral ends of circuit substrate 10, or even less than 1 mm in other embodiments.

In preferred embodiments, the conductive pattern 12 can be formed near the peripheral end parts of the circuit substrate 10 because of the method used in the partitioning of the circuit substrate 10. While some preferred methods of partitioning circuit substrate 10 shall be described in detail below, generally speaking, individual circuit substrates 10 are preferably separated from a large-size substrate by partitioning the metal substrate in a unique manner (e.g., with a cutter). In the related art example described above, margins near the peripheral end parts of circuit substrate 10 were required because the circuit substrates were partitioned by a press. On the other hand, preferred embodiments herein enable the margins to be eliminated and a conductive pattern 12 to be formed over substantially the entire or the entire top surface of circuit substrate 10.

Fourth, circuit elements 13 will now be described. Preferably, the circuit elements 13 are mounted by solder or brazing material onto predetermined locations of conductive pattern 12. In various embodiments, passive elements and/or active elements can be employed generally as circuit elements 13. In some cases where a power transistor is to be mounted, the transistor is preferably mounted onto a heat sink that is affixed to the conductive pattern. With the preferred embodiments of the invention, a circuit element 13 can be positioned at substantially any location upon the circuit substrate 10. That is, a circuit element 13 can be positioned near a peripheral end part of circuit substrate 10. For example, a circuit element can be positioned on the top surface of circuit substrate within about 2 mm from a peripheral end part of circuit substrate 10, or within about 1 mm from a peripheral end part of a circuit substrate, or even less.

Figure 2A:
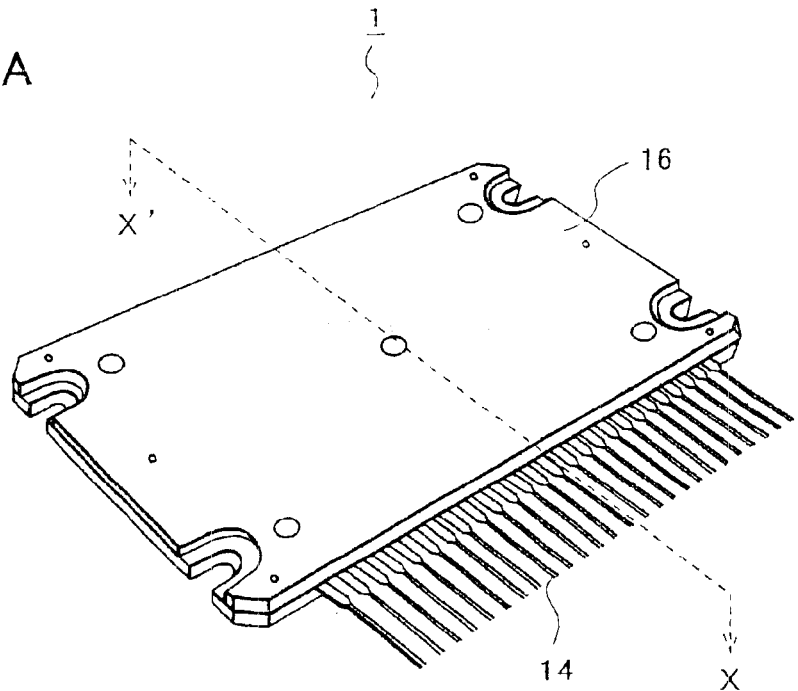
FIG. 2(A) is a perspective view and FIG. 2(B) is a sectional view of a hybrid integrated circuit device according to some illustrative embodiments.
Figure 2B:
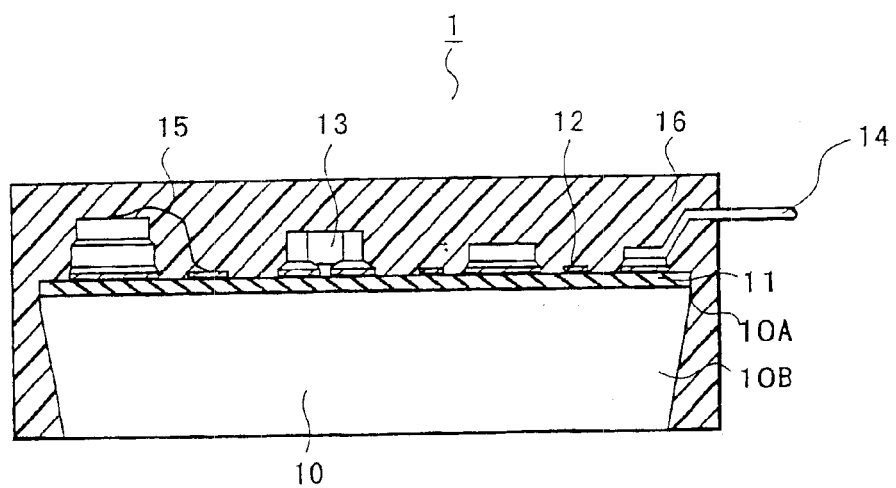
Figure 3:
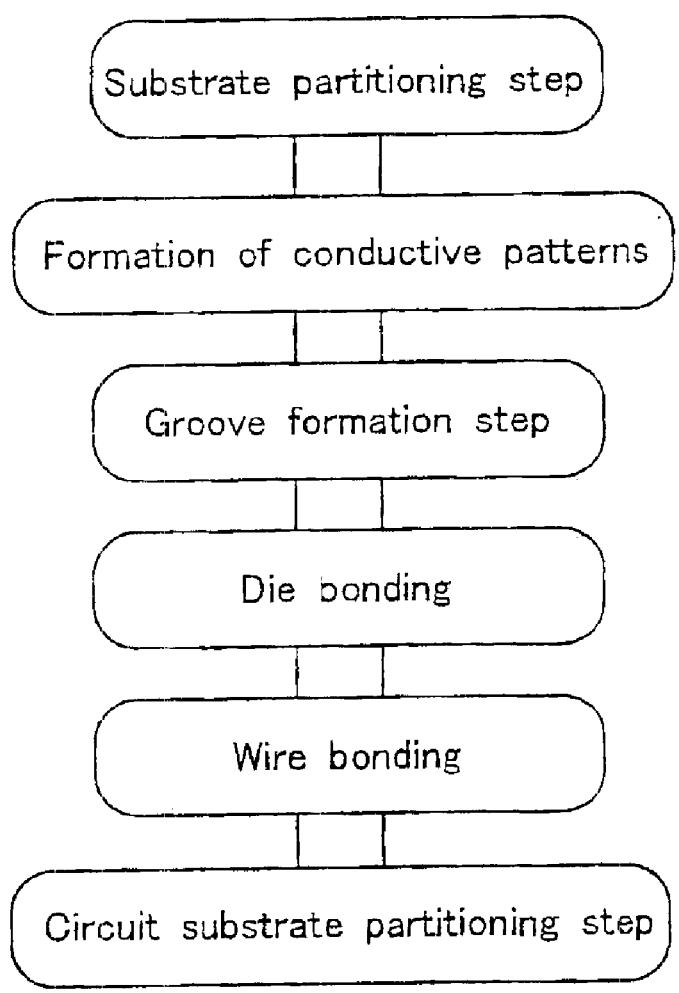
FIG. 3 is a flowchart of a hybrid integrated circuit device manufacturing method according to some illustrative embodiments.

In some embodiments, as shown in FIG. 2(B), a heat sink 13A is mounted to a predetermined location of conductive pattern 12. A power transistor can be mounted on a top surface of this heat sink and the power transistor can be electrically connected with conductive pattern 12 by, e.g., metal wires 15. In these cases, the heat sink 13A can now be positioned at substantially any location on the circuit substrate 10. Specifically, heat sink 13A can be positioned even near a peripheral end part within, e.g., about 2 mm from a peripheral end of circuit substrate 10, or even less. Once again, the heat sink 13 can be formed up to near the peripheral end parts of circuit substrate 10 because of the preferred methods of partitioning the circuit substrate 10 according to the present invention.

As explained above, while some preferred methods of partitioning circuit substrate 10 shall be described in detail below, generally speaking, individual circuit substrates 10 are preferably separated from a large-size substrate by partitioning the metal substrate in a unique manner. In the related art example described above, margins near the peripheral end parts of circuit substrate 10 were required because the circuit substrates were partitioned by a press. Furthermore, since a heat sink 13, onto which a power transistor is mounted, had the greatest height among the circuit elements 13, it could not be positioned at a peripheral part of circuit substrate 10. The preferred embodiments of the present invention enable the margins to be eliminated and enable, e.g., a heat sink 13A to be mounted at substantially any location on the top surface of circuit substrate 10. In various embodiments, this same substantially-any-location benefit can be made available to passive elements, active elements and/or any other circuit elements 13.

In some embodiments, leads 14 are affixed to pads formed of conductive pattern 12 and have a function of performing input and output with respect to the exterior. In addition, a power transistor, etc., can be mounted face-up and electrically connected with the conductive pattern 12 by, e.g., metal wires 15. Furthermore, an overcoat of resin, etc., can be applied to locations of the conductive pattern 12 at which an electrical connection is not made.

The preferred arrangement, etc., of the hybrid integrated circuit that is formed on circuit substrate 10 according to some preferred embodiments of a hybrid integrated circuit device 1 shall now be described with reference to FIGS. 2(A)–(B). FIG. 2(A) is a perspective view of hybrid integrated circuit device 1 and FIG. 2(B) is a sectional view along line X–X' of FIG. 2(A).

The preferred structure of hybrid integrated circuit device 1, according to this illustrative embodiment, shall now be described with reference to FIGS. 2(A)–(B). In the hybrid integrated circuit device 1 shown in these Figures, the hybrid integrated circuit device 1 is preferably sealed in resin as shown.

As shown in FIG. 2(B), an insulating resin 16 preferably has a function of sealing the hybrid integrated circuit, including, for example, circuit elements 13, etc., that are disposed on a top surface of a circuit substrate 10. With respect to the insulating resin 16, any appropriate resin may be employed, such as, by way of example only, a thermoplastic resin (e.g., which seals upon being injection molded), a thermosetting resin (e.g., which seals upon being transfer molded) and/or other appropriate materials may be employed.

As shown in FIG. 2(B), a side-face of circuit substrate 10 preferably has a vertical part 10A and an inclined part 10B. Preferably, an angle formed between the top surface and the vertical part 10A of circuit substrate 10 is or is approximately a right angle. On the other hand, an angle formed between the bottom surface and the inclined part 10B of circuit substrate 10 is preferably an obtuse angle as shown. In some illustrative embodiments, the angle can be substantially the same as that depicted in the Figures (all of the appended Figures being to scale in some illustrative and non-limiting embodiments). In this manner, when resin sealing is applied with the bottom surface of circuit substrate 10 exposed as in the FIG. 2(B) (i.e., the bottom or rear surface being that shown at the very bottom of FIG. 2(B)), insulating resin 16 can set around the inclined parts 10B. In this manner, the insulating resin can create an anchor effect between inclined parts 10B and the insulating resin 16.

In preferred embodiments, the arrangement of hybrid integrated circuit device 10 described above provides one or more, preferably all, of the following effects.

First, since the conductive pattern 12 can be formed up to near the end parts of the circuit substrate 10, in cases where the same circuit as that of another existing example is formed, the size of the entire hybrid integrated circuit device can be made small.

Second, since the circuit elements 13 can be positioned up to near the end parts of circuit substrate 10, the degree of freedom of designing the electrical circuit can be improved. Furthermore, since the density of the pattern can be improved, in cases where the same circuit as that of an existing related art example is formed, the size of the entire hybrid integrated circuit device can be reduced.

Third, since an anchor effect is provided between inclined parts 10B of the circuit substrate 10 and the insulating resin 16, a separation of the circuit substrate 10 from insulating resin 16 can be prevented.

Fourth, in preferred embodiments, the parts at which the side faces of circuit substrate 10 continue to the rear surface are formed to have an obtuse angle without a rounded shape. In this manner, in some embodiments, in a step of using a mold die for sealing in insulating resin 16 with the rear surface of the circuit substrate being exposed, insulating resin 16 can be prevented from entering into gaps between the mold die and the circuit substrate 10. Insulating resin 16 can thus be prevented from becoming attached to the rear surface of circuit substrate 10. Thus, in preferred embodiments, the corner between the rear surface of the substrate 10 and the inclined part 10B is not rounded in a manner that may facilitate resin flow therearound.

2. Second Embodiment (Showing, e.g., Illustrative Methods)

Some preferred methods for manufacturing a hybrid integrated circuit device, such as, e.g., a device similar to that described above, will now be described with reference to FIGS. 3–11. First, the preferred overall process of this embodiment shall be described with reference to the flowchart of FIG. 3. In this embodiment, a hybrid integrated circuit device is preferably manufactured using at least some, preferably all, of the following steps: cutting and dividing a large-size substrate (e.g., a metal substrate) into mid-size substrates by partitioning the large-size substrate; forming conductive patterns of a plurality of hybrid integrated circuits on a top surface of each mid-size substrate; forming grooves in a lattice form on a surface of each mid-size substrate on which an insulating layer is not provided; performing die bonding to mount circuit elements onto the conductive patterns; performing wire bonding; separating individual circuit substrates by cutting the remaining thickness parts at the grooves of the substrate and the insulating layer, etc. Then, the separated circuit substrates 10 are preferably sealed in an insulating resin. The preferred embodiments of each of these respective steps will be described below.

First step (see FIG. 4):

In this step, a large-size metal substrate 10A' is preferably partitioned to form mid-size metal substrates 10B'.

Figure 4A:
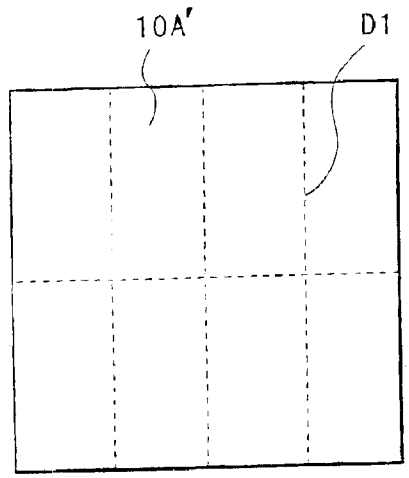
FIG. 4(A) is a plan view.

First, a large-size metal substrate 10A' can be prepared as shown in FIG. 4(A). The size of large-size substrate 10A' can be, for example, approximately 1 m² (1 square meter) or more. However, the size of the substrate 10A' can vary based on circumstances. In some embodiments, the substrate 10A' can be an aluminum substrate, both surfaces of which have been subject to alumite treatment. Preferably, an insulating layer is provided on the top surface of metal substrate 10A'. A copper foil, which is to become conductive patterns, is preferably formed on the top surface of the insulating layer.

Figure 4B:
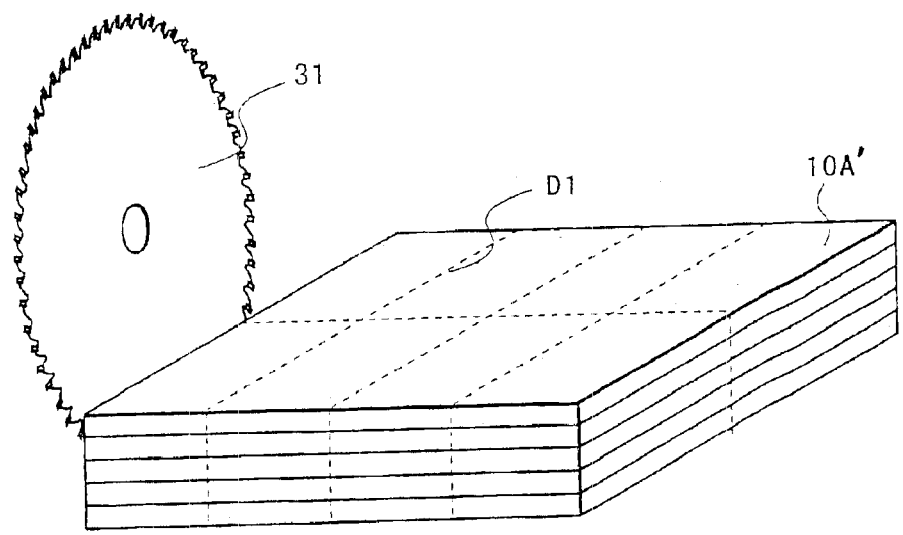
FIG. 4(B) is a perspective view.

Next, as shown in FIG. 4(B), the metal substrate 10A' is partitioned along dicing lines D1 by a cutter 31. In the illustrative embodiment, the cutter 31 includes a rotary saw. However, various other cutters can be used in other embodiments, such as, e.g., knives, blades, scissors, guillotines, shears, reciprocated cutters, rotary cutters and/or various other cutters (see, e.g., other embodiments discussed below). In the illustrated embodiment, a plurality of sheets of metal substrates 10A' can be overlapped and partitioned simultaneously. Preferably, the saw 31 partitions the metal substrate 10A' along dicing lines D1 while rotating at a high speed. The terminology "dicing line" is used to identify the locations along which the partitioning is to be effected and does not necessarily require physical lines or features to be present on the substrate. In this illustrated example, a large-size metal substrate 10A' with a generally square shape is partitioned into eight parts along dicing lines D1 and made into elongated mid-sized metal substrates 10B'. In the illustrated example, the shape of a mid-sized metal substrate 10B' is such that the length of the long side is about twice the length of the short side.

Figure 4C:
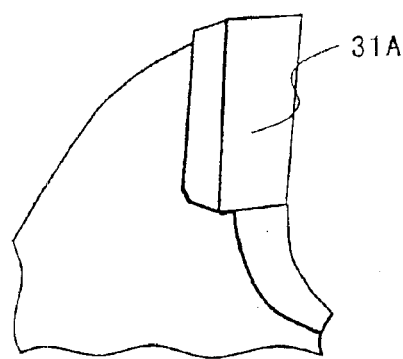
FIG. 4(C) is an enlarged view showing aspects of a hybrid integrated circuit device manufacturing method according to some illustrative embodiments.

While a variety of cutters 31 could be used, in some preferred embodiments, a rotary saw having features as shown in FIG. 4(C) is provided. In that regard, a preferred shape, etc., of a blade edge of a saw 31 is shown in FIG. 4(C). FIG. 4(C) is an enlarged view of the vicinity of a blade edge 31A of the saw 31. As shown, the end part of blade edge 31A is formed to be flat. Preferably, a diamond material is embedded therein. By rotating a saw with such blade edges at a high speed, the metal substrate 10A' can be readily partitioned along dicing lines D1. Once again, various other embodiments can employ different cutters.

Preferably, etching can be performed on a mid-sized metal substrate 10B' manufactured by this step to remove the copper foil partially and thereby form conductive patterns. Though the number of conductive patterns depends on the size of metal substrate 10B' and the size of a hybrid integrated circuit, conductive patterns that form, for example, several dozen to several hundred hybrid integrated circuits can be formed on a single metal substrate 10B'.

Figure 5A:
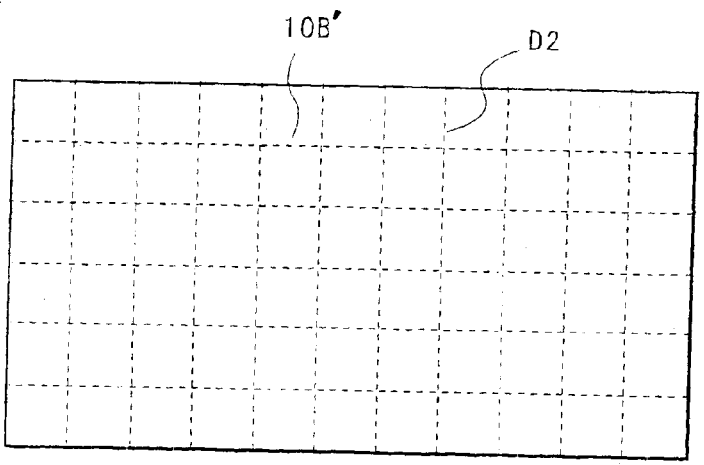
FIG. 5(A) is a plan view.
Figure 5B:
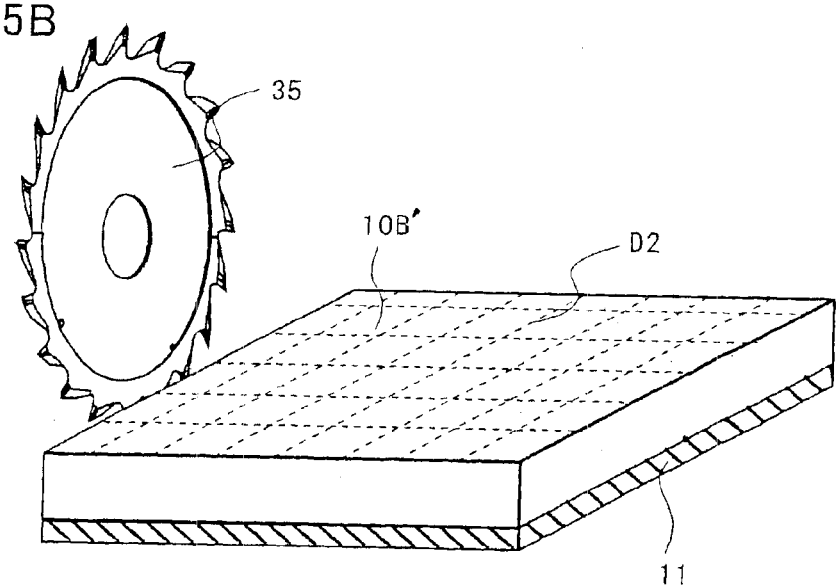
FIG. 5(B) is a perspective view.
Figure 5C:
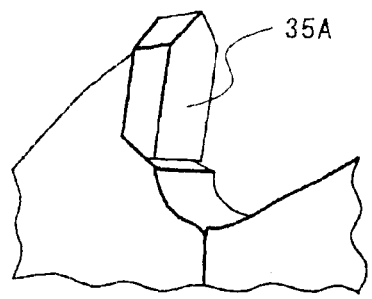
FIG. 5(C) is an enlarged view showing aspects of a hybrid integrated circuit device manufacturing method according to some illustrative embodiments.

Second step (see FIGS. 5–6):

In this step, grooves 20 are preferably formed in lattice form on the surface of mid-sized metal substrate 10B' on which an insulating layer is not provided. FIG. 5(A) is a plan view of an illustrative mid-sized metal substrate 10 that had been partitioned in a prior step. FIG. 5(B) is a perspective view, showing an illustrative condition in which grooves can be formed in the substrate 10A' using a V-cut saw 35. FIG. 5(C) is an enlarged view of a blade edge 35A of the blade 35 shown in FIG. 5(B).

With reference to FIGS. 5(A)–(B), a V-cut saw 35 can be rotated at a high speed to form grooves in the metal substrate along dicing lines D2. In preferred embodiments, the dicing lines D2 are situated in a lattice form. In preferred embodiments, the dicing lines D2 correspond to boundary lines of individual conductive patterns formed on insulating layer 11. While in the illustrated embodiment, a single cutter, e.g., saw 35, is depicted, various embodiments can employ a plurality of cutters, if desired.

FIG. 5(C) is an enlarged view of the vicinity of a blade edge 35A of the saw 35 illustrating a preferred shape of the V-cut saw 35. In this regard, the V-cut saw 35 is preferably provided with a plurality of blade edges 35A having a shape substantially as shown. Preferably, the shape of a blade edge 35A corresponds to a shape of a groove to be provided in the metal substrate 10A'. In the illustrated example, grooves with a V-shaped cross section are formed on the rear surface of the metal substrate (e.g., a surface on which insulating layer 11 is not provided). The shape of a blade edge 35A is preferably also substantially a V-shape. Preferably, a diamond material is embedded in blade edge 35A.

The preferred shape of metal substrate 10B' in which grooves 20 have been formed will now be described with reference to FIGS. 6(A)–6(B). In that regard, FIG. 6(A) is a perspective view of the metal substrate 10B' with which grooves have been formed by V-cut saw 35 and FIG. 6(B) is a sectional view of metal substrate 10B'.

Figure 6A:
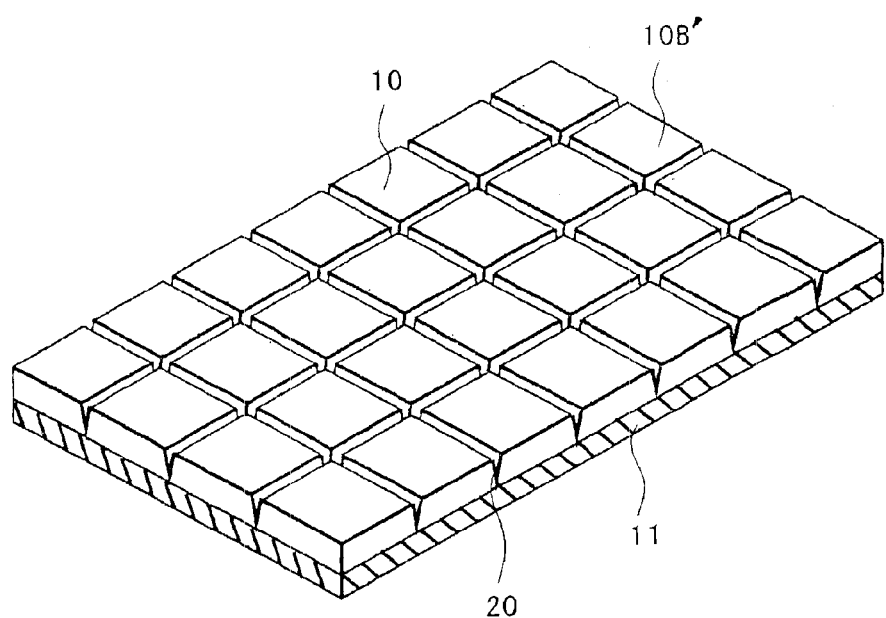
FIG. 6(A) is a perspective view and FIG. 6(B) is a sectional view showing aspects of a hybrid integrated circuit device manufacturing method according to some illustrative embodiments.
Figure 6B:
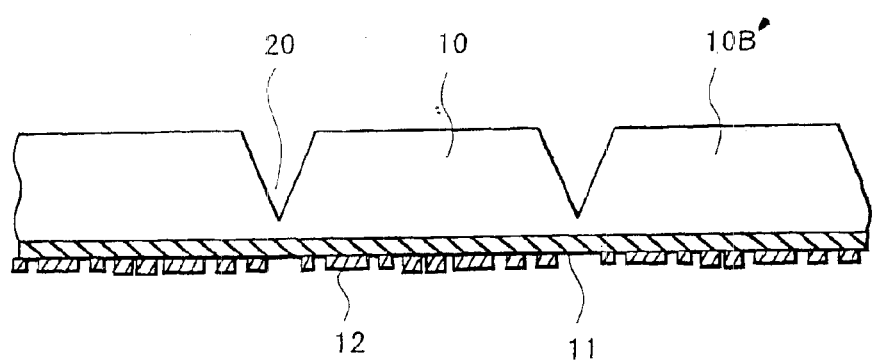

As shown in FIG. 6(A), grooves 20 are preferably formed in a lattice form on the surface of metal substrate 10B' on which insulating layer 11 is not provided. In this embodiment, since the grooves are formed using a V-cut saw 35 having substantially V-shaped blade edges 35A, the grooves 20 are formed to have a substantially V-shaped cross-section. In preferred embodiments, the central lines of grooves 20 (e.g., at an apex of the "V") correspond to the boundary lines of the individual conductive patterns 12 formed on insulating layer 11.

The preferred shape, etc., of a groove 20 will now be described with reference to FIG. 6(B). Here, a groove 20 is preferably formed to have a substantially V-shaped cross section. The depth of groove 20 is preferably made shallower than the thickness of metal substrate 10B'. Thus, in the present step, the metal substrate 10B' is not partitioned into individual circuit substrates 10. That is, the individual circuit substrates 10 are connected at the remaining thickness parts of the metal substrate 10B' that correspond to the groove 20 parts. Thus, until partitioned into the individual circuit substrates 10, the metal substrate 10B' can be handled as a single, sheet-like object. Preferably, if "burrs" are formed in this step, the "burrs" are removed, such as, e.g., by performing high-pressure washing.

Third step (see FIGS. 7–9):

In this step, the circuit elements 13 are preferably mounted onto conductive patterns 12 and electrical connections are made between the circuit elements 13 and the conductive patterns 12.

Figure 7:
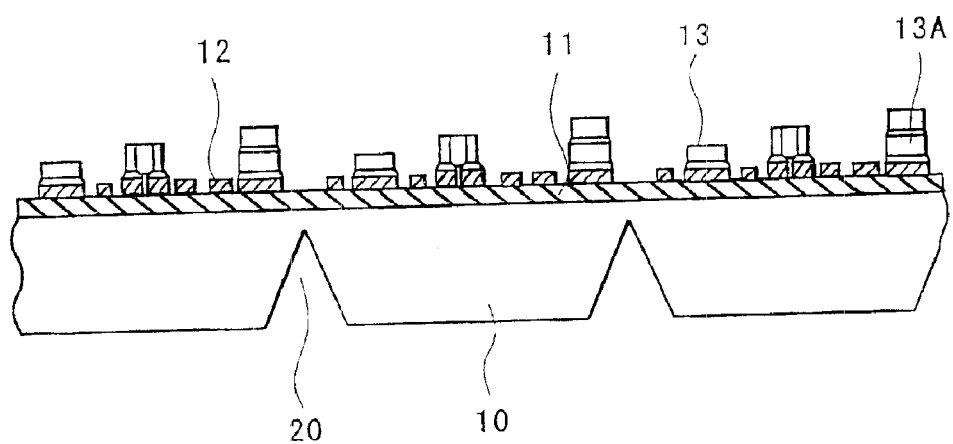
FIG. 7 is a sectional view showing aspects of a hybrid integrated circuit device manufacturing method according to some illustrative embodiments.

A preferred die bonding step, in which circuit elements 13 can be mounted onto conductive patterns 12 shall now be described with reference to FIG. 7. FIG. 7 is a sectional view showing a condition in which circuit elements 13 have been mounted onto conductive patterns 12. Preferably, the circuit elements 13 are mounted onto predetermined locations of conductive patterns 12 by, for example, soft solder or other soldering material. As mentioned above, conductive patterns 12 are preferably formed near the peripheral end parts of circuit substrates 10. The circuit elements 13 can thus also be mounted near the peripheral end parts of circuit substrates 10. Also, a heat sink 13A, on the upper surface of which is mounted a power transistor, is a circuit element that is typically higher in height in comparison to other circuit elements. Thus, with a hybrid integrated circuit device manufacturing method using a press as in the related art, a heat sink 13A could not be positioned near a peripheral end part of a circuit substrate. As shall be described below, in some preferred embodiments of the present invention, the circuit substrates 10 can be partitioned individually using, e.g., a circular cutter. Thus, a heat sink 13A and/or another circuit element 13 with increased height can even be positioned near a peripheral end part of a circuit substrate.

Figure 8:
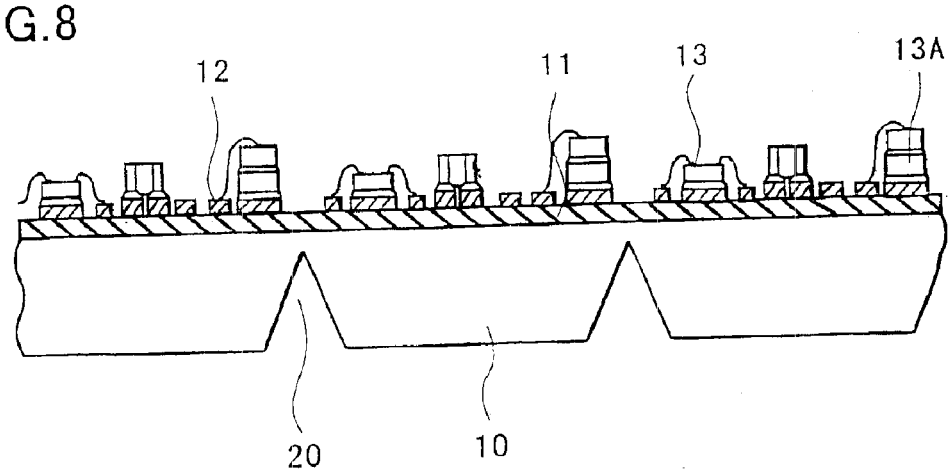
FIG. 8 is a sectional view showing aspects of a hybrid integrated circuit device manufacturing method according to some illustrative embodiments.

A preferred wire bonding step in which electrical connections are made between the circuit elements 13 and the conductive patterns 12 shall now be described with reference to FIG. 8. FIG. 8 is a sectional view showing a condition where circuit elements 13 are electrically connected with conductive pattern 12 by metal wires 15. Here, wire bonding is preferably performed in a batch process on, for example, several dozen to several hundred hybrid integrated circuits formed on a single substrate 10B'.

Figure 9:
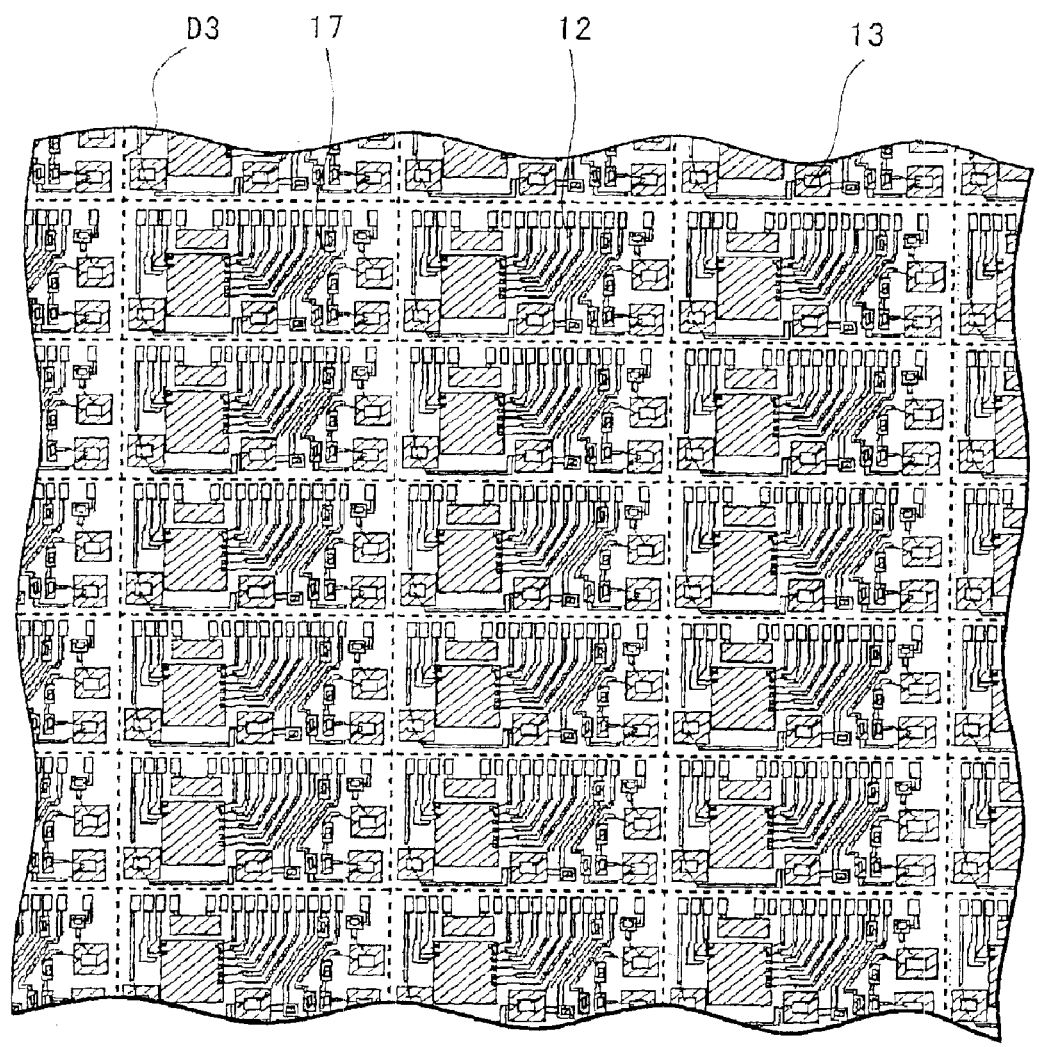
FIG. 9 is a plan view showing aspects of a hybrid integrated circuit device manufacturing method according to some illustrative embodiments.

Illustrative hybrid integrated circuits that have been formed on substrate 10B' shall now be described specifically with reference to FIG. 9. FIG. 9 is a plan view of a part of hybrid integrated circuits 17 formed on metal substrate 10B'. In preferred embodiments, as depicted by the wavy line edges, an even greater number of hybrid integrated circuits 17 are preferably formed. As shown by dotted lines in FIG. 9, the substrate 10B' can be partitioned into individual circuit substrates 10 along dicing lines D3. As depicted in this illustrative Figure, the conductive patterns 12 that form the individual hybrid integrated circuits can be formed very close to the dicing lines D3. In this manner, the conductive patterns 12 can be formed over substantially the entire or the entire the top surface of the substrate 10B'. As also illustrated, heat sinks 13A and other circuit elements 13 can also be disposed at peripheral parts of the hybrid integrated circuits.

In the preferred embodiments described above, hybrid integrated circuits were formed in a batch on a top surface of a substrate 10B' having an elongated shape. In some embodiments, if, e.g., there are restrictions of the manufacturing device for performing the die bonding or wire bonding the substrate 10B' can be partitioned into desired sizes in a step prior to the present step. In one illustrative example, a metal substrate having a square shape can be obtained by partitioning the metal substrate 10B' in two pieces in a step prior to the present step.

Figure 10A:
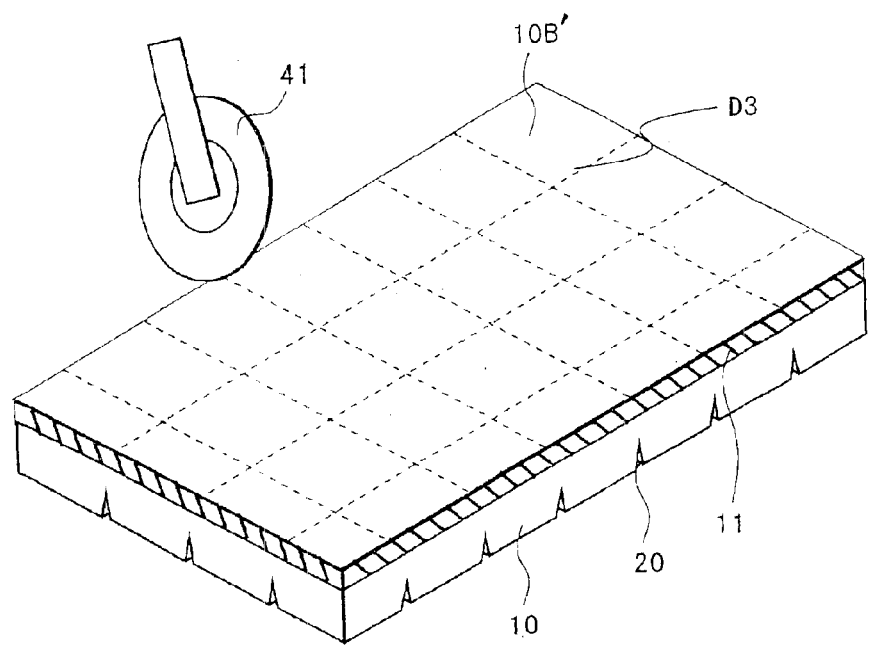
FIG. 10(A) is a perspective view and FIG. 10(B) is a sectional view showing aspects of a hybrid integrated circuit device manufacturing method according to some illustrative embodiments.
Figure 10B:
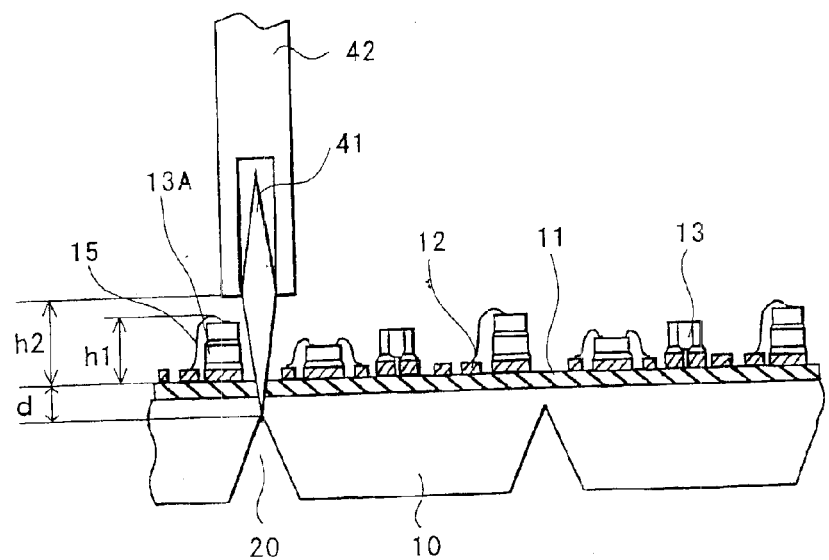
Figure 11A:
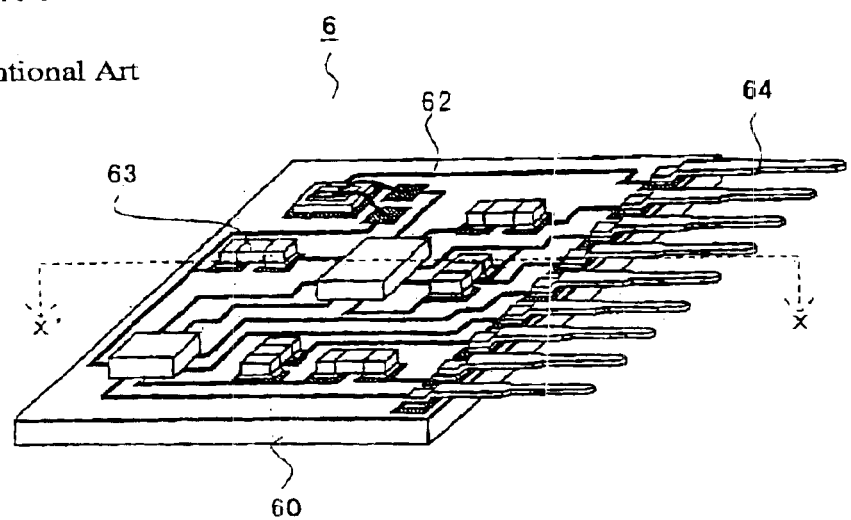
FIG. 11(A) is a perspective view and FIG. 11(B) is a sectional view for explaining a hybrid integrated circuit device in the related art.
Figure 11B:
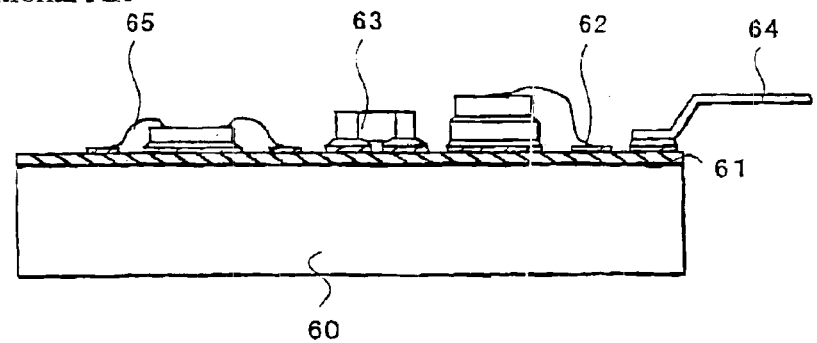
Figure 12A:
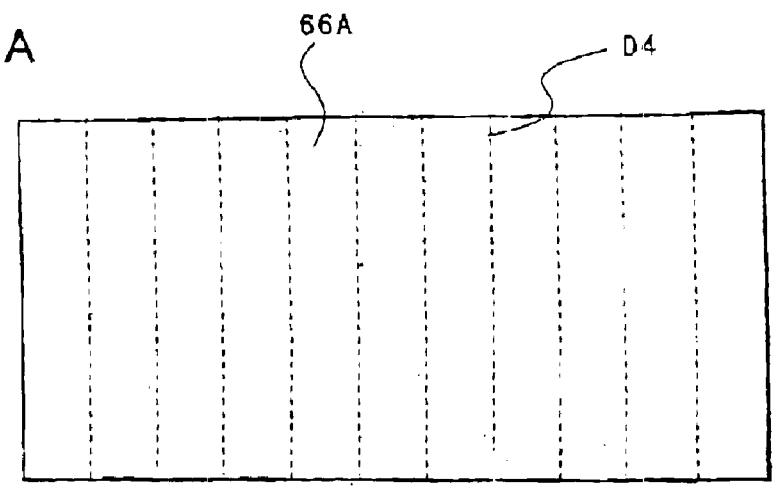
FIG. 12(A) is a plan view and FIG. 12(B) is a sectional view for explaining a hybrid integrated circuit device manufacturing method in the related art.
Figure 12B:
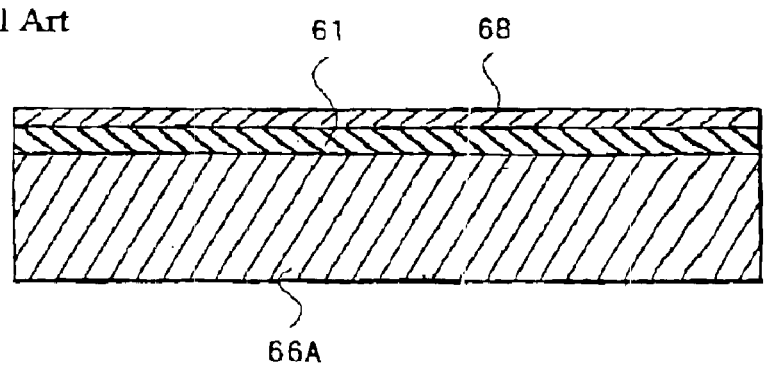
Figure 13A:
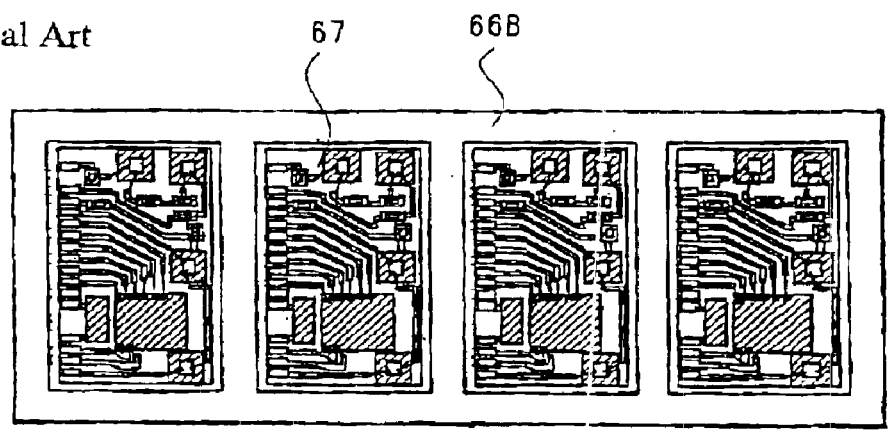
FIG. 13(A) is a plan view and FIG. 13(B) is a sectional view for explaining a hybrid integrated circuit device manufacturing method in the related art.
Figure 13B:
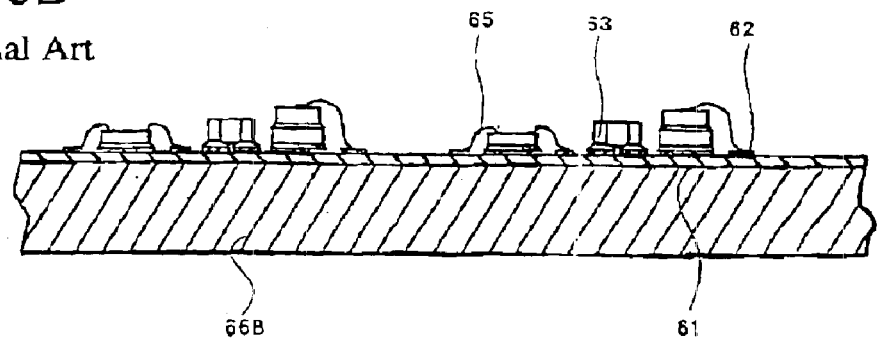
Figure 14:
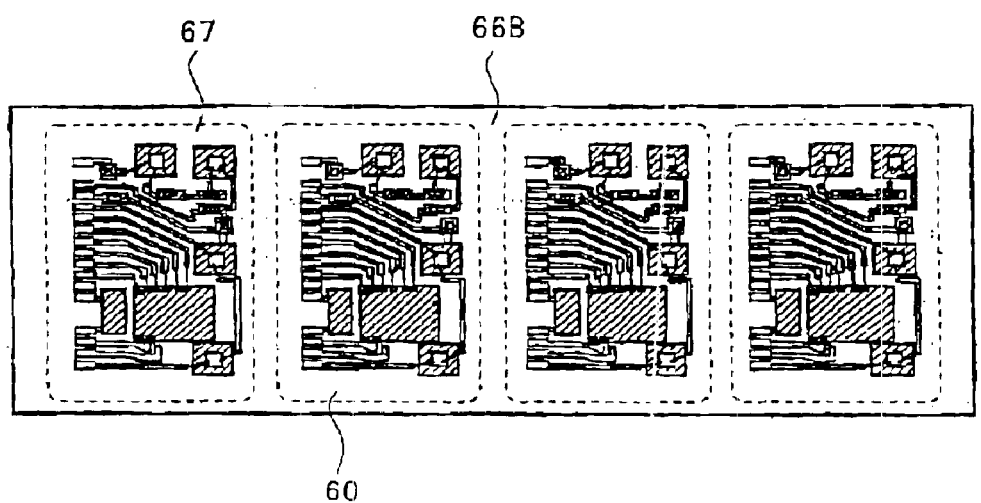
FIG. 14 is a plan view for explaining a hybrid integrated circuit device manufacturing method in the related art.

Fourth step (see FIG. 10):

In this step, the remaining thickness parts at the grooves of metal substrate 10B' and insulating layer 11 are preferably cut to separate the metal substrate 10B' into individual circuit substrates 10. FIG. 10(A) is a perspective view, showing the condition where a metal substrate 10B' is partitioned into individual circuit substrates 10 using a circular cutter 41. FIG. 10(B) is a sectional view of FIG. 10(A). Although not shown in FIG. 10(A), a plurality of hybrid integrated circuits can be already formed on insulating layer 11.

As shown in FIG. 10(A), circular cutter 41 is preferably used in this illustrative embodiment to force-cut the metal substrate 10B' along the dicing lines D3. The metal substrate 10B' can thereby be partitioned into individual circuit substrates 10. As shown in FIG. 10(B), the circular cutter 41 preferably force-cuts the surface of metal substrate 10, on which insulating layer 11 is provided, at parts corresponding to the central lines (e.g., along the apexes) of the grooves 20. Preferably, each groove 20 has a substantially V-shaped cross section. In this manner, the circular cutter 41 can cut the remaining thickness parts of the metal substrate 10B' and the insulating layer 11 at parts at which grooves 20 have been formed most deeply (e.g., the deepest parts of the grooves).

The preferred details of circular cutter 41 shall now be described with reference to FIG. 10(B). The circular cutter 41 preferably has the shape of a circular disk. Preferably, as shown in FIG. 10(B), the peripheral edge part is formed into an acute angle. Preferably, the central part of circular cutter 41 is fixed to a supporting part 42 in a manner enabling free rotation of circular cutter 41 (such as, e.g., so as to rotate about a central axis). While the above-described saw 31 cut the metal substrate 10B' while being rotated at high speed by a driving force (such as, e.g., via a drive motor or the like), the circular cutter 41 is preferably not driven by a driving force. Preferably, the circular cutter 41 freely rotates such that it rotates as it is moved along a dicing line D3 while a part of circular cutter 41 is pressed against metal substrate 10B' (e.g., due to the contact therebetween). In some embodiments, a circular cutter 41 can operate in a manner generally similar to that of a common rotatable-disk pizza cutting tool.

The preferred size of the circular cutter 41 shall now be described with reference to FIG. 10(B). With reference to FIG. 10(B), let d be a length obtained by adding the thickness of the remaining part of metal substrate 10B' at a part at which a groove 20 has been formed and the thickness of insulating layer 11. And, let h1 be a length from the top part of the highest element among circuit elements 13 to the top surface of insulating layer 11. In this case, a radius of circular cutter 41 (e.g., h2 plus d) is preferably set longer than the length obtained by adding d1 and h1. By this setting, circuit substrates 10 can be readily partitioned without failure from metal substrate 10B'. In addition, a lower end of a supporting part 42, which preferably supports the circular cutter 41, can be prevented from contacting and damaging the circuit element 13.

The preferred details of the partitioning of the metal substrate 10B' by a circular cutter 41 shall now be described with reference to FIG. 10(B). As mentioned above, in preferred embodiments, a heat sink 13A and/or another circuit element 13 with some height can be positioned at a peripheral part of circuit substrate 10. The position of a heat sink 13A may thus be close to a dicing line D3 as shown in FIG. 10. The position of a supporting part 42 can be set so that supporting part 42 will not contact the heat sink 13A in such a case.

For example, if h1 is the distance from a top part of an element with the greatest height among circuit elements 13 to the top surface of insulating layer 11, the length h2 from the lower end of supporting part 42 to the top surface of insulating layer 11, is preferably set longer than h1. While the supporting part 42 is shown as having a lower end proximate a central axis of the cutter 41, the lower end can have a dissimilar position in other embodiments. In the illustrated embodiment, the top part of a metal wire 15 extending from, e.g., a power transistor that is mounted to a heat sink 13A, is the highest part within the hybrid integrated circuit. In this case, the lower end of supporting part 42 is preferably set at a position that is higher than the top part of metal wire 15. By thus setting the position of the lower end of supporting part 42, damaging of the metal wire 15 can be prevented.

Then, the circuit substrates 10, which have been separated individually in the above step are then completed as products upon being subject to, for example, the steps of sealing the hybrid integrated circuits, lead cutting, etc.

In some circumstances, the foregoing embodiments can provide one or more, preferably all, of the following effects.

First, when a large-size metal substrate is partitioned using, e.g., a saw 31 that rotates at high speed, the occurrence of "burrs" can be made extremely low in comparison to the related art method of partitioning a substrate by shearing. As a result, the generation of defective products, resulting from the short-circuiting of a hybrid integrated circuit due to "burrs" in an intermediate stage, etc., of the manufacturing process, can thus be prevented.

Second, since a plurality of overlapped large-size metal substrates 10A' can be partitioned simultaneously using, e.g., a saw 31, the work efficiency can be improved.

Third, even when the saw 31 becomes worn, the exchange of saw 31 can be a comparatively simple task and can be performed quickly. Thus, the work efficiency can be improved in comparison to the related art case where a shearing blade needs to be exchanged.

Fourth, grooves are formed at parts of metal substrate 10B' that correspond to the boundaries of the individual circuit substrates 10. As a result, even if "warping" occurs across the entirety of metal substrate 10B' in the process of, e.g., transporting metal substrate 10B', the thinned parts corresponding to the grooves 20 will bend first, while the remaining portions can remain substantially unbent. Accordingly, degradation of the flatness of the individual circuit substrates 10 can thus be inhibited.

Fifth, the mounting of, for example, a few dozen to a few hundred hybrid integrated circuits on a single metal substrate 10B' is enabled. The etching step, die bonding step, and wire bonding step can thus be performed as batch processes. The productivity can thereby be improved.

Sixth, in the step of partitioning the metal substrate 10B' into individual circuit substrates 10, a circular cutter 41 without a driving force can be rotated by pressing it against metal substrate 10B' so as to partition the metal substrate 10B'. In this manner, since the remaining thickness parts at grooves 20 and insulating layer 11 are thus cut by circular cutter 41, cutting chips will be virtually eliminated. Accordingly, short-circuiting of the hybrid integrated circuits in the manufacturing process can thus be prevented.

Seventh, the metal substrate 10B' can be partitioned by pressing a circular cutter 41 against regions corresponding to grooves 20 (such as, e.g., at regions above the grooves). Preferably, the lowering of the voltage resistance of the devices due to generation of cracks in resin layer 11 can thus be prevented. Furthermore, the flatness of substrate 10B' can be secured.

Eighth, even when circular cutter 41 becomes worn, the exchange of circular cutter 41 can be a comparatively simple task and can be performed quickly. The productivity can thus be improved.

Ninth, in the preferred embodiments, individual circuit substrates can be separated by "cutting" a metal substrate using, e.g., a cutter, such as, for example, a cutter saw 31 or a circular cutter 41. In cases where circuit substrates are separated using a press as in the related-art example, different blades needed to be prepared in accordance with the sizes of the circuit substrates to be manufactured. In preferred embodiments of the present invention, the manufacturing of hybrid integrated circuit devices with circuit substrates that differ in size can be accommodated by simply changing the dicing lines (i.e., by changing locations along which the cutters are moved). In some embodiments, the cutters can be moved via various moving means, such as, by way of example only, a robot arm that can be controlled via a controller (e.g., to control movement, path of movement, etc.) and/or other means.

Tenth, in preferred embodiments, a plurality of hybrid integrated circuits can be mounted in a matrix form on a single metal substrate 10B'. Since the respective hybrid integrated circuits can be very close to each other, substantially the entire surface of metal substrate 10B' can be made into circuit substrates 10. As a result, the waste loss of material can be substantially diminished.

While illustrative embodiments of the invention have been described herein, the present invention is not limited to the various preferred embodiments described herein, but includes any and all embodiments having modifications, omissions, combinations (e.g., of aspects across various embodiments), adaptations and/or alterations as would be appreciated by those in the art based on the present disclosure. The limitations in the claims are to be interpreted broadly based on the language employed in the claims and not limited to examples described in the present specification or during the prosecution of the application, which examples are to be construed as non-exclusive. For example, in the present disclosure, the term "preferably" is non-exclusive and means "preferably, but not limited to." Means-plus-function or step-plus-function limitations will only be employed where for a specific claim limitation all of the following conditions are present in that limitation: a) "means for" or "step for" is expressly recited; b) a corresponding function is expressly recited; and c) structure, material or acts that support that structure are not recited.

What is claimed is:

1. A hybrid integrated circuit device, comprising:
   a circuit substrate formed with metal and having an insulating layer over a top surface;
   at least one conductive pattern over said insulating layer;
   circuit elements electrically connected to mounted over said at least one conductive pattern;
   said at least one conductive pattern positioned very near at least one peripheral end of said circuit substrate; and
   said circuit substrate having side faces with inclined parts that incline inwards toward a center of said circuit substrate to anchor said circuit substrate to said insulating resin.

2. The device of claim 1, wherein said at least one conductive pattern is positioned over substantially the entire top surface of said circuit substrate.

3. The device of claim 2, wherein said at least one conductive pattern is positioned at parts of the top surface of said circuit substrate that are within about 2 mm of said at least one peripheral end of said circuit substrate.

4. The device of claim 2, wherein said at least one conductive pattern is positioned at parts of the top surface of said circuit substrate that are within about 2 mm of a plurality of peripheral ends of said circuit substrate.

5. The device of claim 2, wherein said top surface of said circuit substrate is generally rectangular with four peripheral edges and wherein said at least one conductive pattern is positioned at parts of the top surface of said circuit substrate that are within about 2 mm of each of said peripheral edges of said top surface of said circuit substrate.

6. The device of claim 2, wherein said substrate includes conductive patterns within about 1 mm of at least one peripheral end.

7. The device of claim 5, wherein said substrate includes conductive patterns within about 1 mm of at least one peripheral end.

8. The device of claim 1, wherein said substrate includes conductive patterns positioned within 2 mm of a plurality of peripheral ends.

9. The device of claim 8, wherein said substrate includes conductive patterns positioned within 1 mm of said plurality of peripheral ends.

10. The device of claim 1, wherein said substrate is formed of a material principally comprising aluminum or copper.

11. The device of claim 1, wherein said substrate is an aluminum substrate.

12. The device of claim 11, wherein top and rear surfaces of said aluminum substrate are alumite treated.

13. The device of claim 1, wherein said insulating layer is a resin filled with aluminum.

14. The device of claim 1, further including at least some of said circuit elements being positioned very near at least one peripheral end of said circuit substrate.

15. The device of claim 1, wherein said inclined parts are formed by dicing.

16. The device of claim 1, wherein said at least one conductive pattern is a single conductive pattern layer.

17. A hybrid integrated circuit device, comprising:
a circuit substrate formed with metal and having an insulating layer over a top surface;
at least one conductive pattern over said insulating layer;
circuit elements electrically connected to said at least one conductive pattern;
said circuit elements are positioned very near at least one peripheral end of said circuit substrate; and
said circuit substrate having side faces with inclined parts that incline inwards toward a center of said circuit substrate to anchor said circuit substrate to said insulating resin.

18. The device of claim 17, wherein said circuit elements are positioned at parts of the top surface of said circuit substrate that are within about 2 mm from said at least one peripheral end of said circuit substrate.

19. The device of claim 17, wherein said circuit elements are positioned at parts of the top surface of said circuit substrate that are within about 2 mm from of a plurality of peripheral ends of said circuit substrate.

20. The device of claim 17, wherein a heat sink, having a semiconductor element affixed to its top surface, is positioned at a peripheral part of said circuit substrate.

21. The device of claim 20, wherein said heat sink is positioned at a part of the top surface of said circuit substrate that is within 2 mm from a peripheral end of said circuit substrate.

22. The device of claim 17, wherein said inclined parts are formed by dicing.

23. The device of claim 17, wherein said at least one conductive pattern is a single conductive pattern layer.

24. A hybrid integrated circuit device, comprising:
a circuit substrate;
at least one conductive pattern over said circuit substrate;
circuit elements electrically connected to said at least one conductive pattern;
an insulating resin sealing said circuit substrate, said conductive pattern and said circuit elements; and
said circuit substrate having side faces with inclined parts that incline inwards toward a center of said circuit substrate to anchor said circuit substrate to said insulating resin.

25. The device of claim 24, wherein a rear surface of said circuit substrate is exposed from said resin.

26. The device of claim 25, wherein the side faces of said circuit substrate have generally vertical parts that extend from the top surface of said circuit substrate and said inclined parts extend inwards beneath said vertical parts.

27. The device of claim 26, wherein angles formed between the top surface of said circuit substrate and said vertical parts are substantially right angles.

28. The device of claim 26, wherein angles formed between the rear surface of said circuit substrate and said side faces are obtuse angles.

29. The device of claim 28, wherein said inclined parts are substantially planar and extend from said rear surface upwardly and outwardly.

30. The device of claim 24, wherein said inclined parts are substantially planar and extend from a rear surface of said substrate upwardly and outwardly.

31. The device of claim 24, wherein said inclined parts are formed by dicing.

* * * * *